United States Patent [19]

Michael

[11] Patent Number: 5,572,457
[45] Date of Patent: Nov. 5, 1996

[54] MODULE BOARD INCLUDING CONDUCTOR TRACKS HAVING DISCONNECTABLE CONNECTING ELEMENTS

[75] Inventor: Ewald Michael, Haar, Germany

[73] Assignee: Siemens Aktiengesellschaft, Munich, Germany

[21] Appl. No.: 498,165

[22] Filed: Jul. 5, 1995

[30] Foreign Application Priority Data

Jul. 5, 1994 [DE] Germany .......................... 44 23 567.4

[51] Int. Cl.⁶ .................................... G11C 5/06
[52] U.S. Cl. ............................ 365/52; 365/63
[58] Field of Search ........................ 365/52, 63

[56] References Cited

U.S. PATENT DOCUMENTS

| | | | |
|---|---|---|---|
| 4,656,605 | 4/1987 | Clayton | 365/52 |
| 5,241,643 | 8/1993 | Durkin et al. | 365/52 |
| 5,267,218 | 11/1993 | Elbert | 365/52 |
| 5,272,664 | 12/1993 | Alexander et al. | 365/52 |
| 5,440,519 | 8/1995 | Mart et al. | 365/52 |
| 5,465,229 | 11/1995 | Bechtolsheim et al. | 365/52 |

FOREIGN PATENT DOCUMENTS

| | | |
|---|---|---|
| 3336439 | 5/1984 | Germany . |
| 5-343579 | 12/1993 | Japan . |
| 2130025 | 5/1984 | United Kingdom . |

OTHER PUBLICATIONS

Patent Abstract of Japan No. 58–60559 A (Yoshihara) Apr. 11, 1983, "Multichip Package".

Primary Examiner—David C. Nelms
Assistant Examiner—Trong Phan
Attorney, Agent, or Firm—Herbert L. Lerner; Laurence A. Greenberg

[57] ABSTRACT

A module board in the form of a circuit board includes at least one first integrated circuit and terminal points for the at least one first integrated circuit. External terminals are provided for input/output signals. Conductor tracks have disconnectable connecting elements for connection between the external terminals and the terminal points. A second integrated circuit is disposed between the external terminals and the terminal points for differently varying the input/output signals traveling between the terminal points and the external terminals in dependence on a status of the disconnectable connecting elements.

9 Claims, 6 Drawing Sheets

FIG.1
FIG.3
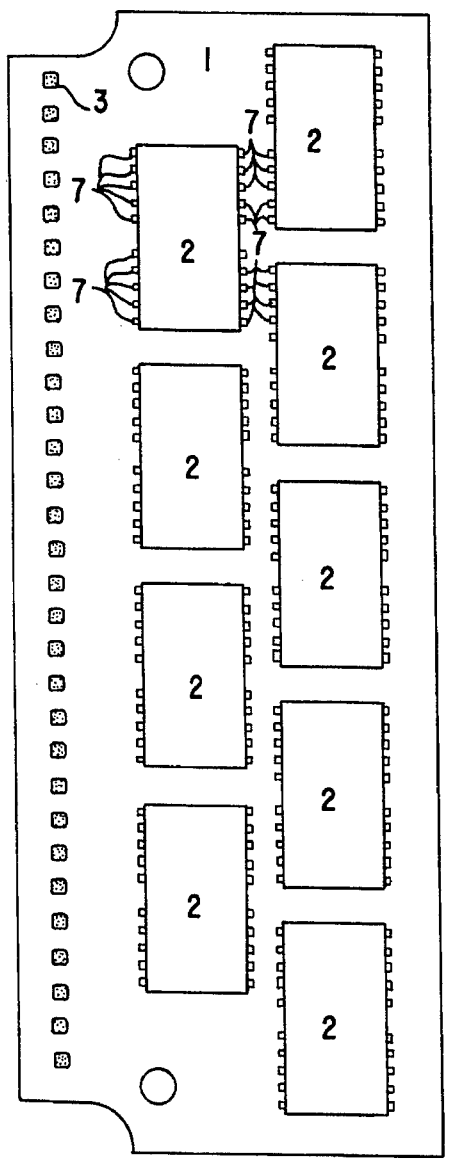
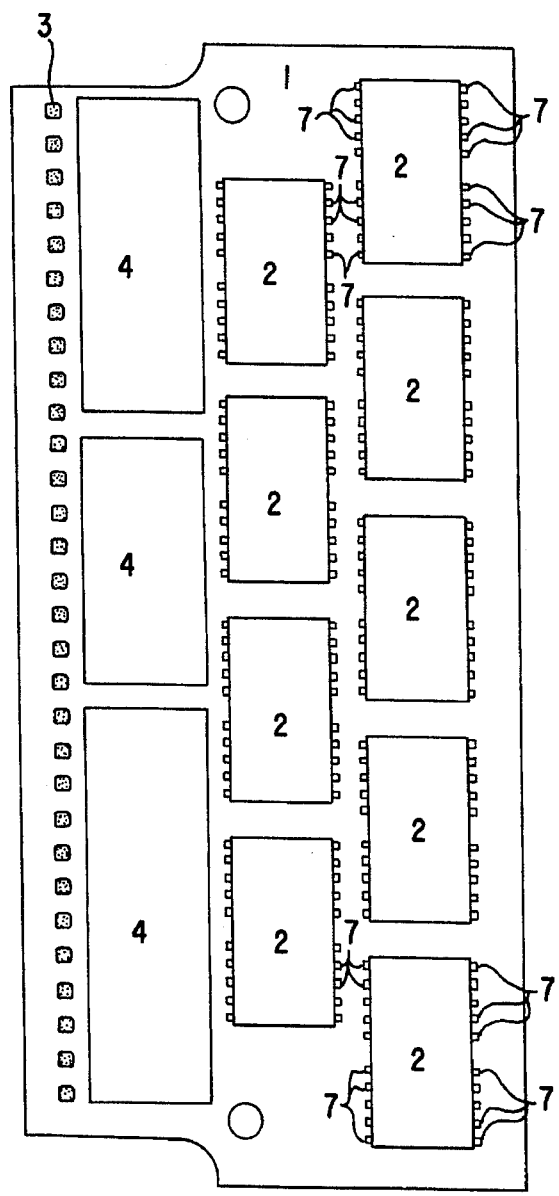

MODULE BOARD INCLUDING CONDUCTOR TRACKS HAVING DISCONNECTABLE CONNECTING ELEMENTS

BACKGROUND OF THE INVENTION

Field of the Invention

The invention relates to a module board, for instance for memory components of computer systems, in the form of a circuit board, including conductor tracks, first terminal points for at least one first integrated circuit, and external terminals for input/output signals, the conductor tracks having disconnectable connecting elements for connection between the external terminals and the first terminal points.

Such a module board is known from U.S. Pat. No. 4,656,605.

Memory components in computer systems are being used less and less in the form of single components and more in the form of memory module boards, that is a combination of memory components which are already mounted on a standardized solderable or plug-in circuit board. One example is the SIMM (single in-line memory module) board, which is defined by the JEDEC standard. FIG. 1 shows one such standard DRAM module board which is discussed in detail below and is of the kind described in U.S. Pat. No. 4,656,605.

Those modules can easily be used as memory media in the most various kinds of systems. However, interface problems often arise, for example with regard to whether the system bus is made with TTL or ECL technology; which bus lines are electrically terminated; and so forth. Due to those various interface configurations, complicated additional circuits, such as driver components and error correction circuits, must be used in the computer system. For reasons of both cost and standardization, it is not generally possible for all of the existing interfaces to already be provided in the individual components.

In the prior art, so-called "intelligent" memory module boards are also known, wherein the additional logic required in the memory is implemented in additional integrated circuits on the module board. The additional integrated circuits communicate with the system bus and monitor the flow of data to be written in or read out.

Those so-called "intelligent" module boards can therefore be used in many system configurations, since the additional logic can easily be modified by being programmed to suit existing system requirements. However, that proves to be expensive for relatively simple systems where the complicated additional logic is not always absolutely necessary, and where the memory access speed is not as critical as in mainframes.

SUMMARY OF THE INVENTION

It is accordingly an object of the invention to provide a module board, which overcomes the hereinafore-mentioned disadvantages of the heretofore-known devices of this general type, which has the flexibility to be used in various systems and which at the same time offers cost advantages.

With the foregoing and other objects in view there is provided, in accordance with the invention, a module board in the form of a circuit board, comprising at least one first integrated circuit; terminal points for the at least one first integrated circuit; external terminals for input/output signals; conductor tracks having disconnectable connecting elements for connection between the external terminals and the terminal points; and a second integrated circuit disposed between the external terminals and the terminal points for differently varying the input/output signals traveling between the terminal points and the external terminals in dependence on a status of the disconnectable connecting elements.

In accordance with another feature of the invention, the external terminals are connected directly to the terminal points when the connecting elements are not disconnected.

In accordance with a further feature of the invention, the second integrated circuit is at least one second integrated circuit including a bus termination circuit having an error correction function.

In accordance with an added feature of the invention, the at least one first integrated circuit is an integrated semiconductor memory.

In accordance with an additional feature of the invention, the at least one first integrated circuit is a DRAM memory.

In accordance with yet another feature of the invention, the second integrated circuit is at least one second integrated circuit including a driver circuit.

In accordance with yet a further feature of the invention, there are provided further disconnectable connecting elements for modifying a function of the second integrated circuit in the form of at least one second integrated circuit.

In accordance with yet an added feature of the invention, at least one of the further disconnectable connecting elements and at least one of the second integrated circuits is connectable to reference potentials of the signals being present on the conductor tracks.

In accordance with a concomitant feature of the invention, the at least one second integrated circuit has terminals, and at least one of the further disconnectable connecting elements is a possible connection between two of the terminals of the at least one second integrated circuit.

Other features which are considered as characteristic for the invention are set forth in the appended claims.

Although the invention is illustrated and described herein as embodied in a module board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, top-plan view of a module board in accordance with the prior art;

FIG. 3 is a top-plan view of a module board according to the present invention;

DESCRIPTION OF THE PREFERRED EMBODIMENTS

Figure 2:
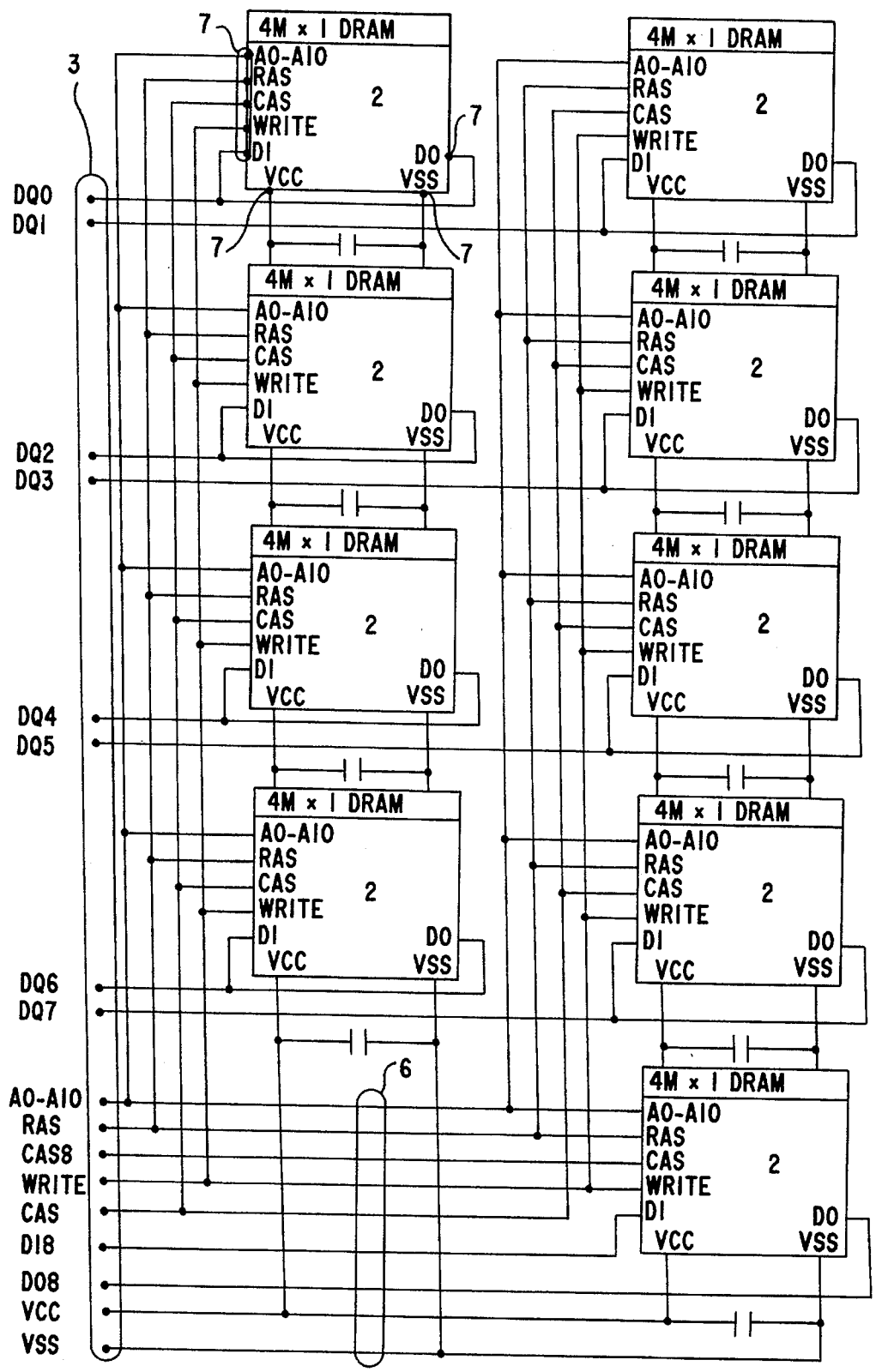
FIG. 2 is a block circuit diagram of the module board of FIG. 1.

Referring now to the figures of the drawing in detail and first, particularly, to FIG. 1 thereof, there is seen a standard DRAM module board or card 1, of the kind described in U.S. Pat. No. 4,656,605. At least one first integrated circuit 2, in this case in the form of DRAM memory components, is mounted at terminal points 7 on the module board 1. External terminals 3 are provided on one side of the module board and act as a system interface, for example, with a computer system. The system interface can be a system bus, for example. The module board 1 is normally constructed as a solderable or plug-in circuit board that is readily interchangeable.

FIG. 2 shows a possible block circuit diagram for the module board of FIG. 1. As it clearly shows, the module board 1 contains only conductor tracks 6 between the first integrated circuits 2 and the external terminals 3.

Although such modules can be easily used as memory media in varied types of systems, interface problems often arise, as is discussed above.

Figure 4:
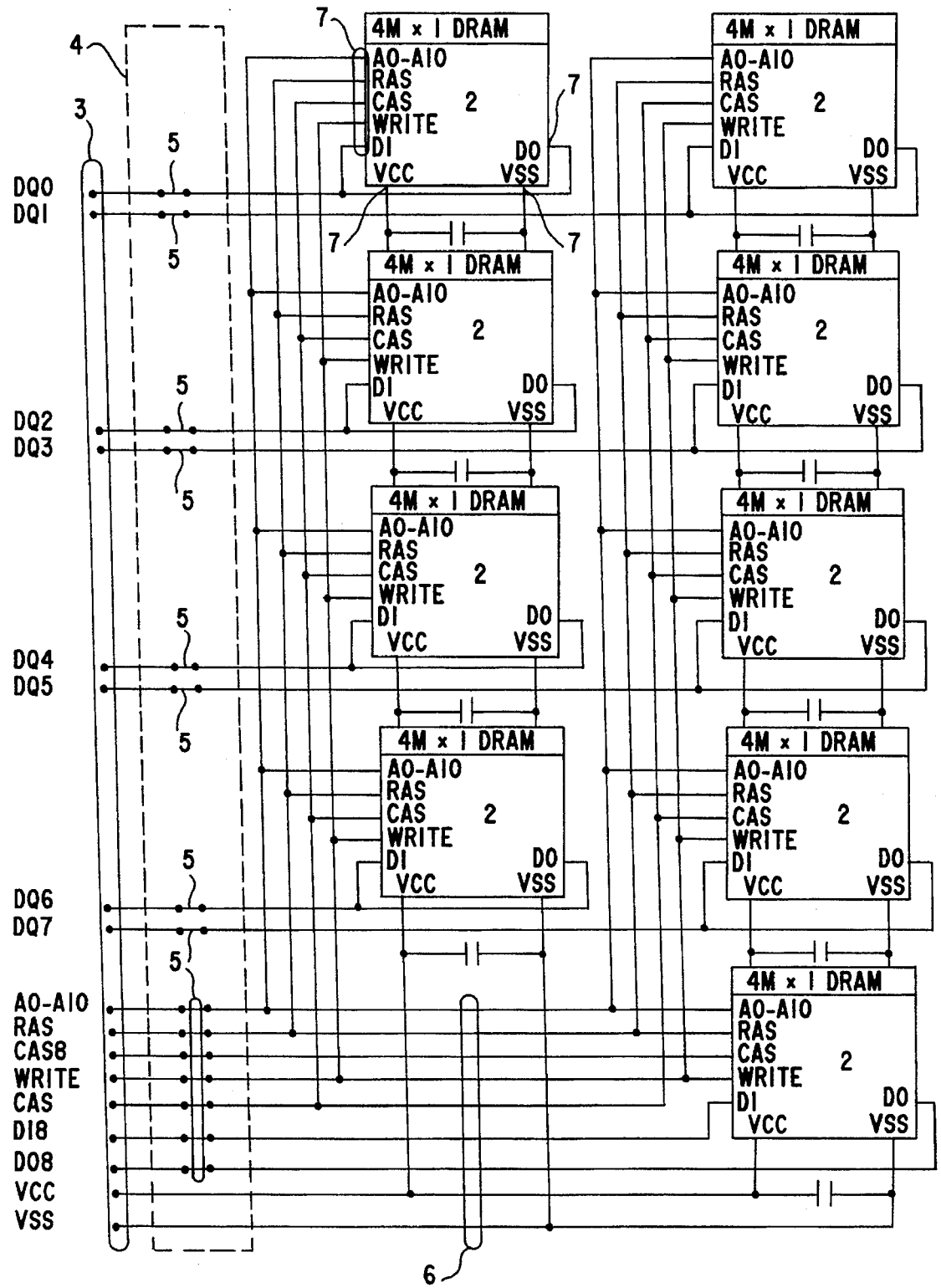
FIGS. 4–6 are block circuit diagrams of various wiring options for the module board of FIG. 3.
Figure 5:
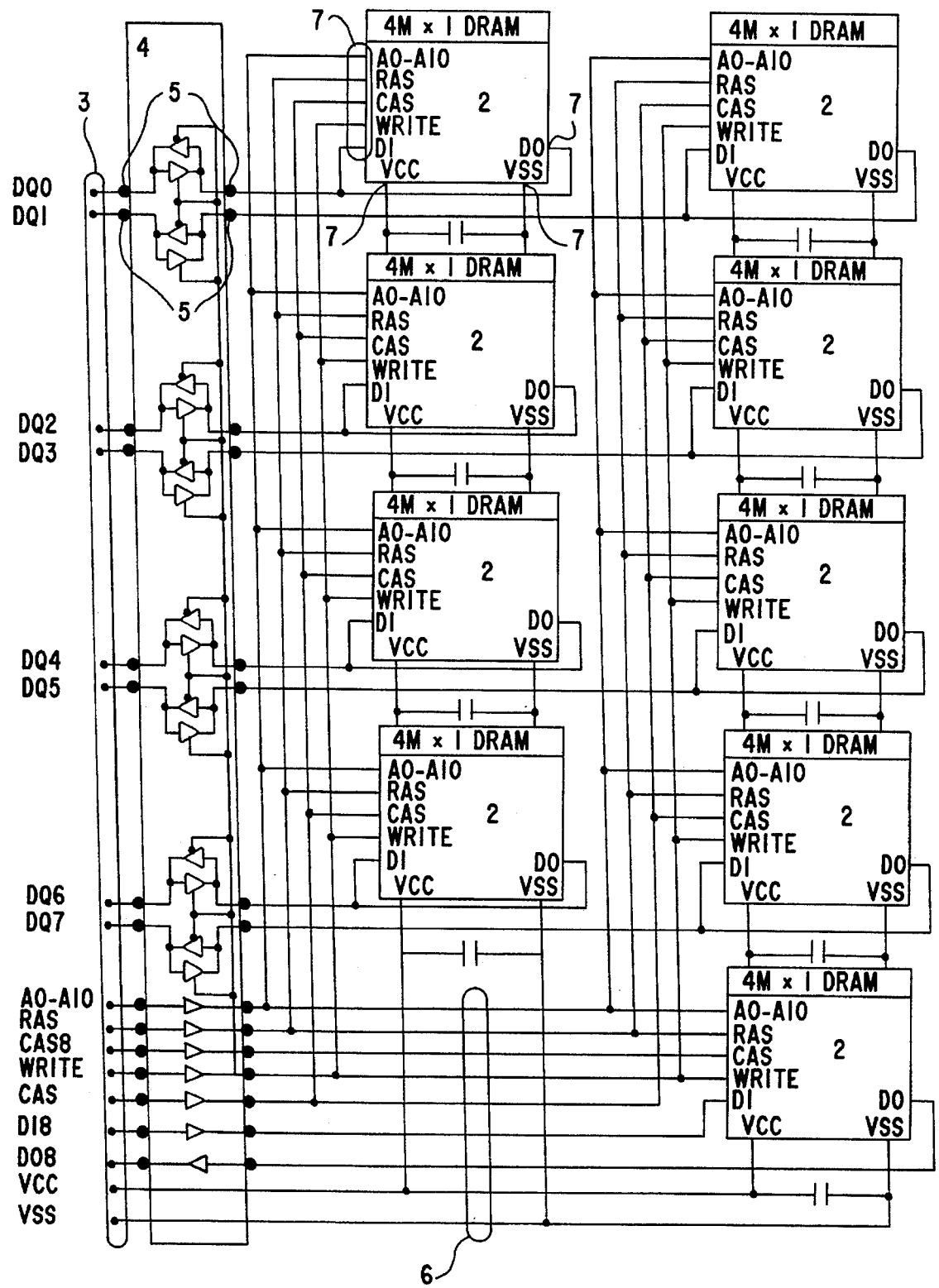
Figure 6:
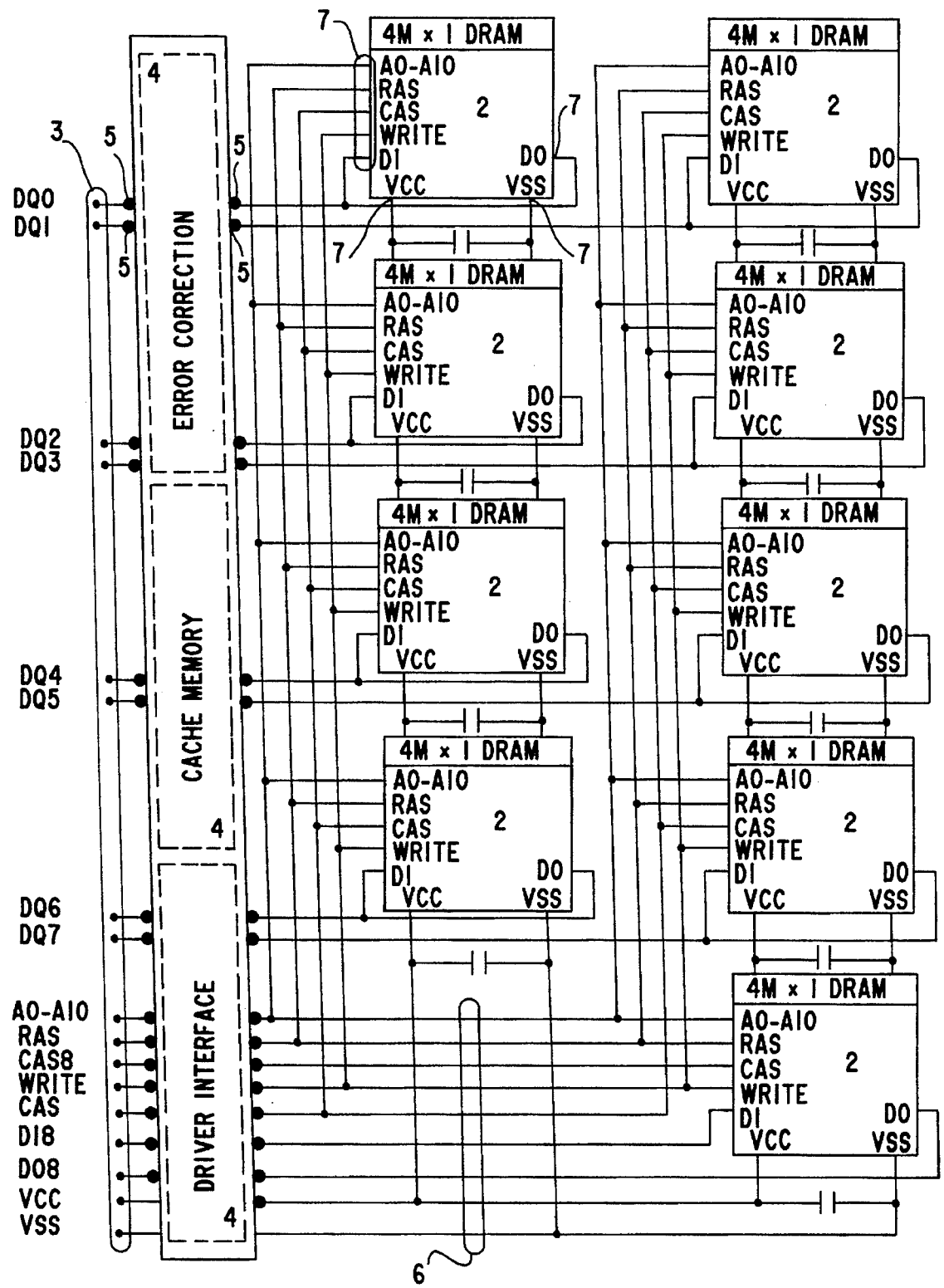

FIG. 3 shows a module board or card in accordance with the present invention, and FIGS. 4–6 show various wiring options for the module board of FIG. 3. Unlike the module board shown in FIGS. 1 and 2, in this case the conductor tracks 6 for the external terminals 3 are constructed in such a way that they can be selectively connected with the first integrated circuits 2 through the use of disconnectable connecting elements 5 shown in FIG. 4, or they can be connected to the first integrated circuits 2 through at least one further or second integrated circuit 4. These second integrated circuits 4 may, for example, be driver circuits and/or additional logic, such as error recognition and correction circuits, cache memories, refresh circuits, and so forth.

FIG. 4 shows a possible circuit diagram of the module board of FIG. 3, in which the external terminals 3 are connected directly to the first integrated circuits 2 by disconnectable connecting elements 5.

In that case, a second integrated circuit 4, which is shown in dotted lines in FIG. 4, is not provided. It is therefore not disposed on the module board 1.

Through the use of the disconnectable connecting elements 5, it is possible to use the module board of the present invention without additional components for interface adaptation. However, if driver and/or additional logic circuits are needed, then they can easily be mounted as needed at the terminals which are already provided.

FIG. 5 is a block circuit diagram of the module board of FIG. 3, wherein the disconnectable connecting elements 5 are interrupted, and one (or more) second integrated circuits 4 are connected between the external terminals 3 and the first integrated circuits 2, in this case in the form of memory components. The second integrated circuits 4 are shown in this case as driver components, which are adapted to the system bus requirements.

The block circuit diagram of FIG. 6 shows that the implementation of complicated logic (error recognition and correction, cache memory, automatic refreshing, etc.) is also possible, along with driver circuits, in the second integrated circuits 4. The present invention therefore enables the module board to be modified as needed, from the construction as a standard module board (that is, without the second integrated circuit 4) to an "intelligent" module board, at minimal added expense.

Figure 7:
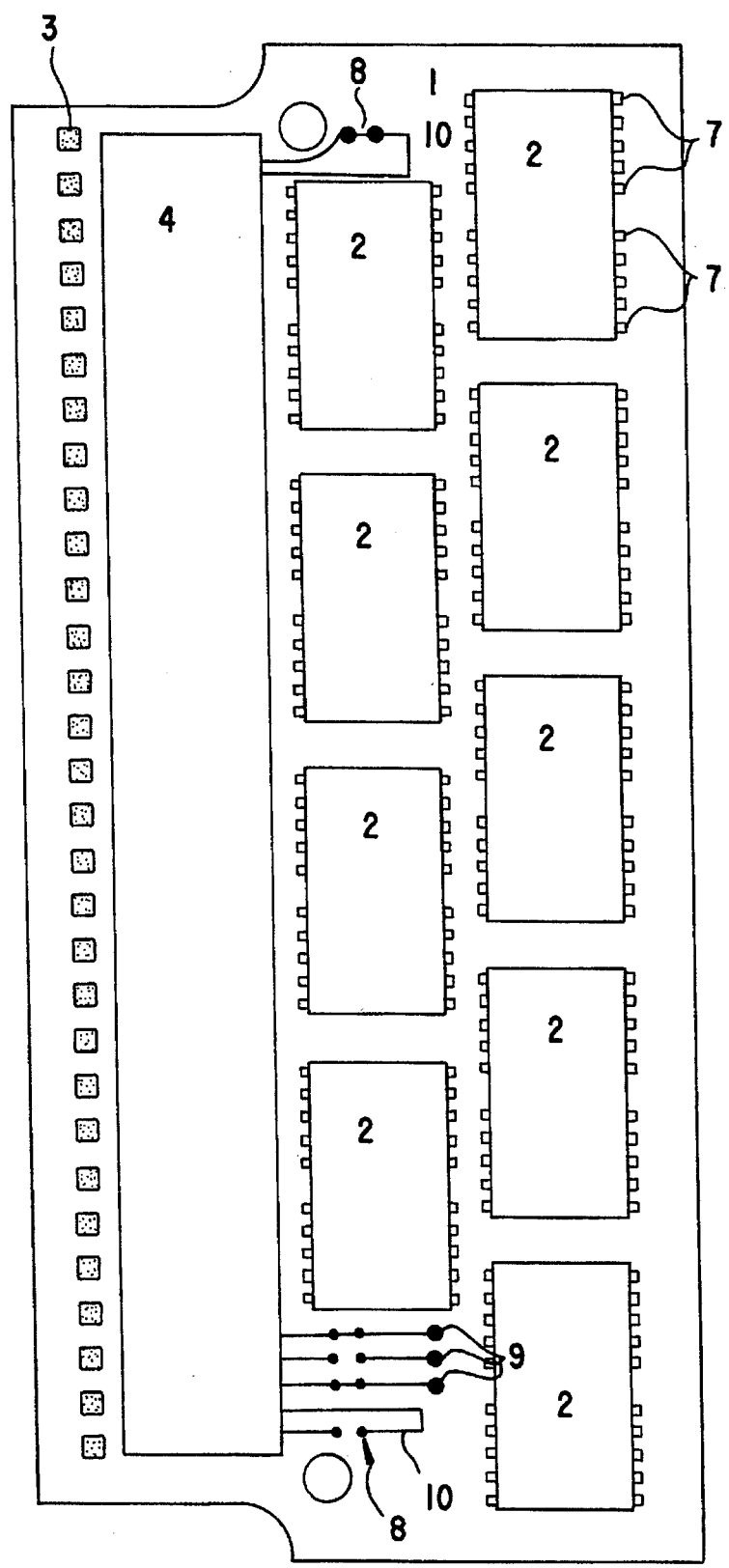
FIG. 7 is a top-plan view of a further module board according to the present invention.

The module board of FIG. 7 also has additional disconnectable connecting elements 8, in order to enable programming of the second integrated circuit 4 for various needs, such as electrical bus termination, TTL/ECL technology, and so forth. These needs of the system can also be carried by signals from the system bus to the module board, for instance, so that the driver circuits will be adapted appropriately.

The additional disconnectable connecting elements 8 can connect the second integrated circuit 4 to ground, for instance, or to the supply voltage or to the signals that are present on the module board, which is accomplished in this case through the use of contact points 9 to the conductor tracks 6 of the module board. The additional disconnectable connecting elements 8 can also connect two terminals of the second integrated circuit together, through the use of the conductor tracks 6. This makes it possible to vary a signal that is present within the second integrated circuit. Through disconnection of one of the additional disconnectable connecting elements 8, it is therefore possible to vary internal signals and voltages of the second integrated circuit 4, in order to enable programming of the second integrated circuit. It is also seen from FIG. 7 that at least one of the further disconnectable connecting elements 8 is a possible connection 10 between two terminals of the at least one second integrated circuit 4.

Although FIG. 7 shows one second integrated circuit 4, as in FIG. 3, space can be provided for a plurality of integrated circuits.

Although the above examples of the invention relate to memory module boards, one skilled in the art will appreciate the fact that the module boards of the invention can also be used for other memory boards or cards besides SIMMs and for other types of semiconductor components.

I claim:

1. A module board in the form of a circuit board, comprising:

at least one first integrated circuit;

terminal points for said at least one first integrated circuit;

external terminals for input/output signals;

conductor tracks having disconnectable connecting elements for connection between said external terminals and said terminal points; and a second integrated circuit disposed between said external terminals and said terminal points for differently varying the input/output signals traveling between said terminal points and said external terminals in dependence on a status of said disconnectable connecting elements.

2. The module board according to claim 1, wherein said external terminals are connected directly to said terminal points when said connecting elements are not disconnected.

3. The module board according to claim 1, wherein said second integrated circuit is at least one second integrated circuit including a bus termination circuit having an error correction function.

4. The module board according to claim 1, wherein said at least one first integrated circuit is an integrated semiconductor memory.

5. The module board according to claim 1, wherein said at least one first integrated circuit is a DRAM memory.

6. The module board according to claim 1, wherein said second integrated circuit is at least one second integrated circuit including a driver circuit.

7. The module board according to claim 1, including further disconnectable connecting elements for modifying a function of said second integrated circuit in the form of at least one second integrated circuit.

8. The module board according to claim 7, wherein at least one of said second integrated circuits is connectable to reference potentials of the signals being present on said conductor tracks through at least one of said further disconnectable connecting elements.

9. The module board according to claim 7, wherein said at least one second integrated circuit has terminals, and at least one of said further disconnectable connecting elements is a possible connection between two of said terminals of said at least one second integrated circuit.

* * * * *